US006433380B2

(12) United States Patent
Shin (10) Patent No.: US 6,433,380 B2
(45) Date of Patent: Aug. 13, 2002

(54) INTEGRATED CIRCUIT CAPACITORS HAVING COMPOSITE TITANIUM OXIDE AND TANTALUM PENTOXIDE DIELECTRIC LAYERS THEREIN

(75) Inventor: Dong-won Shin, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/903,153

(22) Filed: Jul. 11, 2001

Related U.S. Application Data (62) Division of application No. 09/417,859, filed on Oct. 14, 1999, now Pat. No. 6,300,215.

(30) Foreign Application Priority Data

Oct. 19, 1998 (KR) .............................................. 98-43554

(51) Int. Cl.$^7$ ............................................ H01L 27/108
(52) U.S. Cl. ..................... 257/310; 257/303; 257/296; 257/324; 257/325; 257/306; 438/396; 438/239; 438/240; 438/253; 438/399; 438/310; 438/361; 438/313
(58) Field of Search ................................ 257/310, 303, 257/296, 324, 325, 306; 438/396, 239, 240, 253, 399, 310; 361/313

(56) References Cited

U.S. PATENT DOCUMENTS

| | | | |
|---|---|---|---|
| 4,734,340 A | 3/1988 | Saito et al. .................. 428/698 |
| 5,111,355 A | 5/1992 | Anand et al. ................ 361/313 |
| 5,142,438 A | 8/1992 | Reinberg et al. ............. 361/313 |
| 5,185,689 A | 2/1993 | Maniar ........................ 361/313 |
| 5,308,782 A | 5/1994 | Mazuré et al. ................. 437/52 |
| 5,313,089 A | 5/1994 | Jones, Jr. ..................... 257/295 |
| 5,405,796 A | 4/1995 | Jones, Jr. ...................... 437/47 |
| 5,489,548 A | 2/1996 | Nishioka et al. ............... 437/60 |
| 5,552,337 A | 9/1996 | Kwon et al. ................... 437/60 |
| 5,563,090 A | 10/1996 | Lee et al. ...................... 437/60 |
| 5,605,858 A | 2/1997 | Nishioka et al. ............... 437/60 |
| 5,639,685 A | 6/1997 | Zahurak et al. ................ 437/60 |
| 5,656,852 A | 8/1997 | Nishioka et al. ............. 257/632 |
| 5,780,336 A | 7/1998 | Son ............................. 438/251 |
| 5,811,851 A | 9/1998 | Nishioka et al. ............. 257/310 |
| 5,834,357 A | 11/1998 | Kang ........................... 438/396 |
| 5,846,859 A | 12/1998 | Lee ............................. 438/253 |
| 5,877,062 A | 3/1999 | Horii ........................... 438/396 |
| 5,926,707 A | 7/1999 | Seo .............................. 438/238 |
| 6,083,789 A | 7/2000 | Huang et al. ................. 438/254 |
| 6,140,671 A | 10/2000 | Lee ............................. 257/295 |

OTHER PUBLICATIONS

Kwon et al., $Ta_2O_5/TiO_2$ Composite Films for High Density DRAM Capacitors, Technical Digest of the 1993 VLSI Technology Symposium, 1993, pp. 45–46.

*Primary Examiner*—Matthew Smith
*Assistant Examiner*—B. V. Keshavan
(74) *Attorney, Agent, or Firm*—Myers Bigel Sibley & Sajovec

(57) ABSTRACT

Methods of forming integrated circuit capacitors (e.g., DRAM capacitors) include the steps of forming a first capacitor electrode (e.g., polysilicon electrode) on a substrate and then forming a titanium nitride layer on the first capacitor electrode. A tantalum pentoxide dielectric layer is then formed on an upper surface of the titanium nitride layer. A step is then performed to convert the underlying titanium nitride layer into a titanium oxide layer. A second capacitor electrode is then formed on the tantalum pentoxide layer. The step of converting the titanium nitride layer into a titanium oxide layer is preferably performed by annealing the tantalum pentoxide layer in an oxygen ambient in a range between about 700° C. and 900° C. This oxygen ambient provides free oxygen to fill vacancies within the tantalum oxide layer and also provides free oxygen which diffuses into the underlying titanium nitride layer.

4 Claims, 9 Drawing Sheets

(Prior Art)

INTEGRATED CIRCUIT CAPACITORS HAVING COMPOSITE TITANIUM OXIDE AND TANTALUM PENTOXIDE DIELECTRIC LAYERS THEREIN

RELATED APPLICATION

This application is related to Korean Application No. 98-43554, filed Oct. 19, 1998, the disclosures of which are hereby incorporated herein by reference.

This application is a divisional of U.S. application Ser. No. 09/417,859, filed Oct. 14, 1999, now U.S. Pat. No. 6,300,215, the disclosure of which is hereby incorporated herein by reference.

FIELD OF THE INVENTION

The present invention relates to integrated circuit devices and methods of forming integrated circuit devices, and more particularly to integrated circuit capacitors and methods of forming integrated circuit capacitors.

BACKGROUND OF THE INVENTION

It is generally desirable to make memory cells as small as possible so that more memory cells can be integrated into each chip. Higher capacitance storage capacitors can also provide better definition when reading the memory cell, lower soft error rate, and enable lower voltage operation. Therefore, if memory cells can be made smaller and with higher capacitance, semiconductor memory devices can become more highly integrated.

Capacitors having three-dimensional structures have been proposed in an attempt to increase cell capacitance. These types of capacitors usually have a lower electrode in the shape of a fin, a box, or a cylinder. However, the manufacturing processes for forming capacitors with three-dimensional electrode structures may be complicated and defects may be easily generated during the manufacturing processes. Accordingly, research into the use of high dielectric materials for increasing the capacitance of capacitors is actively being conducted to avoid the need for forming capacitor electrodes having three-dimensional structure. Similarly, the use of thin dielectric materials having stable dielectric characteristics are also being considered.

Unfortunately, high dielectric materials such as tantalum pentoxide ($Ta_2O_5$) have reduced dielectric strength when formed as relatively thin layers. For example, whereas bulk tantalum pentoxide may have a dielectric constant in a range between about 22 and 25, thin tantalum pentoxide layers having thickness in a range between about 50A and 100A may only have dielectric constants at levels of about 5–6 when used as capacitor dielectric material. This reduction may be due to the formation of a thin natural oxide layer at an interface between a capacitor electrode and the tantalum pentoxide layer. This thin natural oxide layer reduces the net dielectric constant of the resulting composite dielectric layer containing both the natural oxide layer and tantalum pentoxide layer. This tantalum pentoxide layers may also have relatively poor leakage current and breakdown characteristics. Conventional techniques for forming integrated circuit capacitors having tantalum oxide dielectric layers are described in an article by K. W. Kwon et al., entitled "$Ta_2O_5/TiO_2$ Composite Films for High Density DRAM Capacitors", Technical Digest of the 1993 VLSI Technology Symposium" and in U.S. Pat. Nos. 4,734,340, 5,111,355 and 5,142,438.

Notwithstanding these conventional techniques, there continues to be a need for improved methods of forming integrated circuit capacitors having high dielectric strength and reduced leakage current characteristics.

SUMMARY OF THE INVENTION

It is therefore an object of the present invention to provide improved methods of forming integrated circuit capacitors.

It is another object of the present invention to provide methods of forming integrated circuit capacitors having improved dielectric characteristics.

It is still another object of the present invention to provide methods of forming integrated circuit capacitors containing high dielectric strength materials.

These and other objects, advantages and features of the present invention can be provided by methods of forming integrated circuit capacitors (e.g., DRAM capacitors) that include the steps of forming a first capacitor electrode (e.g., polysilicon electrode) on a substrate and then forming a titanium nitride layer on the first capacitor electrode. A tantalum pentoxide dielectric layer is then formed on an upper surface of the titanium nitride layer. A step is then performed to convert the underlying titanium nitride layer into a titanium oxide layer. A second capacitor electrode is then formed on the tantalum pentoxide layer. The step of converting the titanium nitride layer into a titanium oxide layer is preferably performed by annealing the tantalum pentoxide layer in an oxygen ambient at a temperature in a range between about 700° C. and 900° C. This oxygen ambient provides free oxygen to fill vacancies within the tantalum oxide layer and also provides free oxygen which diffuses into the underlying titanium nitride layer.

According to one preferred aspect of the present invention, the step of forming a titanium nitride layer comprises the steps of depositing a layer of titanium metal on the first capacitor electrode and then converting the layer of titanium metal to titanium nitride by annealing the deposited layer of titanium metal in a nitrogen ambient. Alternatively, the step of forming a titanium nitride layer may comprise the step of depositing titanium nitride on the first capacitor electrode using a titanium chloride source gas.

According to another embodiment of the present invention, methods of forming integrated circuit capacitors include the steps of forming a first polysilicon capacitor electrode on a substrate and forming a titanium nitride layer on the first polysilicon capacitor electrode. Thereafter, a portion of the titanium nitride layer is removed to expose a portion of the first polysilicon electrode. As a preferred embodiment in accordance with this invention, the substrate can be annealed in an $N_2$ ambient.

Thereafter, a tantalum pentoxide layer is formed on the exposed portion of the first polysilicon capacitor electrode, which is followed by annealing step in an oxygen ambient. Then a silicon oxynitride layer is partially formed on a portion of the first polysilicon capacitor electrode. To complete the capacitor structure, a second capacitor electrode is then formed on the tantalum pentoxide layer, opposite the silicon oxynitride layer. This embodiment comprises the steps of forming a first capacitor electrode over a substrate, forming a titanium nitride layer on the first capacitor electrode, and removing a portion of titanium nitride layer to expose the first portion of the first capacitor electrode. Thereafter, the substrate is annealed in a nitrogen ambient, and then a tantalum pentoxide dielectric layer is formed on the remainder of the titanium nitride layer and the exposed first capacitor. Further, the annealing the tantalum pentoxide dielectric layer in an oxygen ambient converts titanium nitride layer into a titanium oxide layer and forms a silicon oxynitride layer on the exposed first capacitor electrode. Finally, a second capacitor electrode is formed on the tantalum pentoxide layer.

Based on this second embodiment, the resulting integrated circuit capacitor may comprise a first capacitor, electrode, a silicon oxynitride layer on a first portion of the first capacitor electrode and a titanium oxide layer on a second portion of the first capacitor electrode. A tantalum pentoxide layer is also provided on the silicon oxynitride layer and on the titanium oxide layer. A second capacitor electrode is also provided on the tantalum pentoxide layer. The second capacitor electrode preferably extends opposite the silicon oxynitride layer and titanium oxide layer. Thus, the resulting integrated circuit capacitor includes a composite dielectric layer. This composite dielectric layer includes silicon oxynitride and titanium oxide (on adjacent portions of a lower capacitor electrode) and an overlying tantalum pentoxide layer which contacts the underlying silicon oxynitride and titanium oxide.

BRIEF DESCRIPTION OF THE DRAWINGS

FIGS. 2 and 6–7 are cross-sectional views of intermediate structures that illustrate methods of forming an integrated circuit capacitors according to a second embodiment of the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Like numbers refer to like elements throughout.

Figure 1:
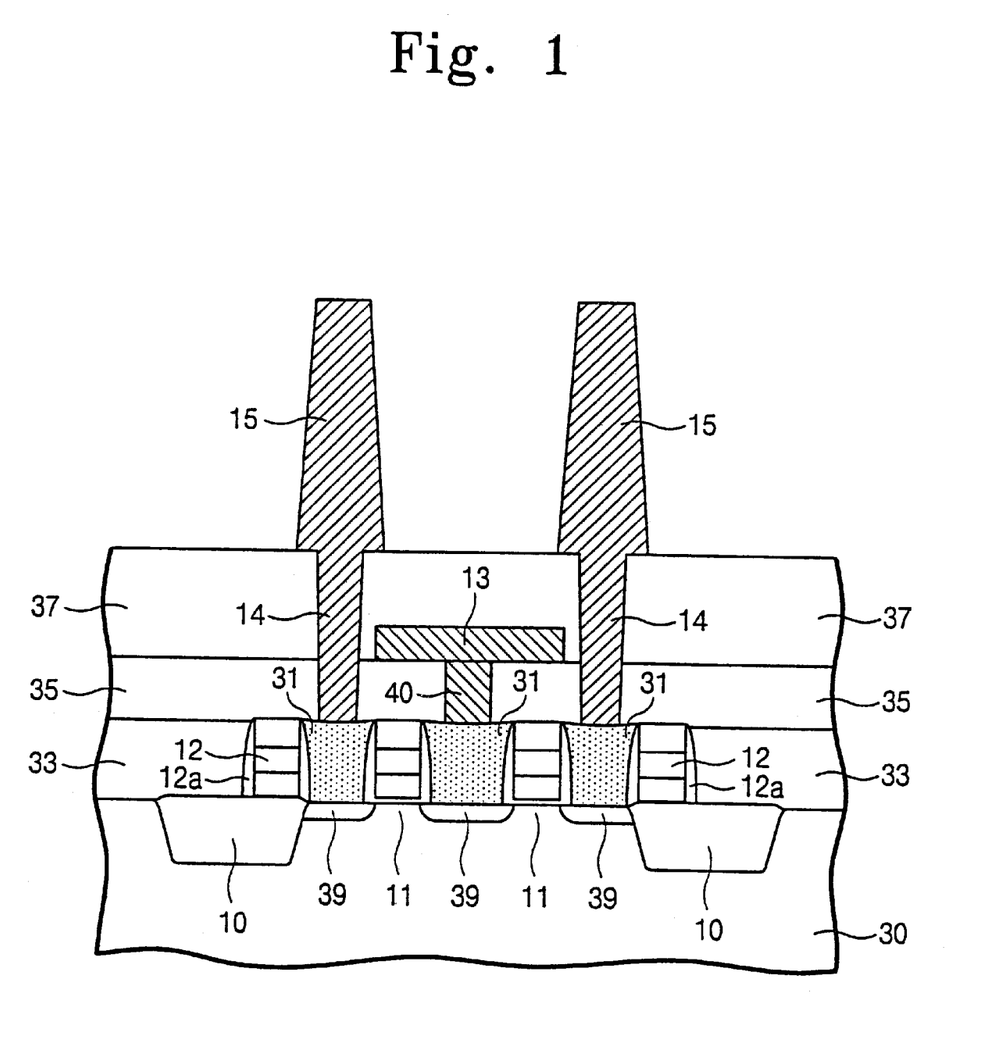
FIGS. 1–3 are cross-sectional views of intermediate structures that illustrate methods of forming an integrated circuit capacitors according to a first embodiment of the present invention.
Figure 2:
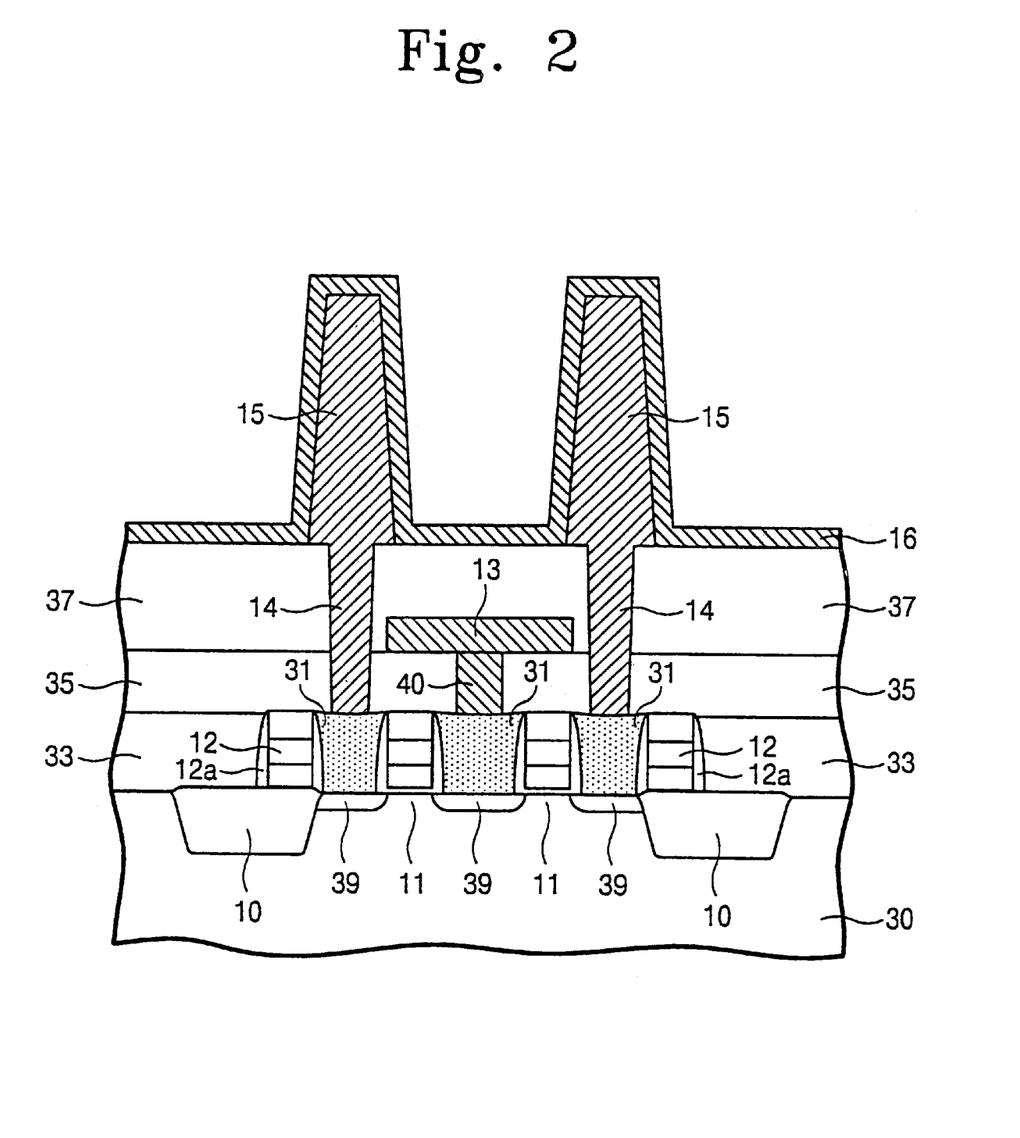

Referring now to FIGS. 1–3, preferred methods of forming integrated circuit capacitors according to a first embodiment of the present invention will be described. In particular, FIG. 1 illustrates the steps of forming a plurality of shallow trench isolation (STI) regions 10 in a semiconductor substrate 30. These shallow trench isolation regions 10 may be patterned to define a semiconductor active region 11 within the substrate 30. A gate oxide layer may also be formed on the active region 11. Then, using techniques well known to those skilled in the art, a plurality of composite gate electrodes 12 may be formed on the active region 11 and trench isolation regions 10, as illustrated. These gate electrodes may constitute the gate electrodes (or word lines) of DRAM memory cell access transistors. Each of these gate electrodes 12 may comprise a composite of an underlying polysilicon layer, an intermediate suicide layer and an electrically insulating capping layer. Impurity regions 39 of predetermined conductivity type (e.g., N-type) may also be formed in the active region 11 in a self-aligned manner by implanting dopants into the substrate 30, using the gate electrodes 12 as an implant mask. Sidewall insulating spacers 12a may then be formed on sidewalls of the gate electrodes 12.

A first electrically insulating layer 33 may be deposited on the gate electrodes 12, as illustrated. Contact holes may then be defined in the first electrically insulating layer 33, to expose the impurity regions 39. These contact holes may then be filled with first conductive plugs 31 (e.g., polysilicon plugs). A second electrically insulating layer 35 may then be formed on the first electrically insulating layer 33, as illustrated. A contact hole may then be defined in the second electrically insulating layer 35, using photolithographically defined etching steps. As illustrated the contact hole may be defined to expose the central conductive plug 31. The contact hole may then be filled with a buried bit line contact 40 and then a bit line 13 may be defined on an upper surface of the second electrically insulating layer 35 using conventional metal deposition and patterning steps, for example.

A third electrically insulating layer 37 is then formed on the bit line 13 and the second electrically insulating layer 35, as illustrated. Using conventional techniques, a plurality of contact holes may be formed in the second and third electrically insulating layers 35 and 37. As illustrated, these contact holes are preferably formed to expose underlying conductive plugs 31. Conventional techniques may then be performed to define a plurality of buried contacts 14 in the contact holes and then define a plurality of first capacitor electrodes 15 (e.g., polysilicon electrodes) on an upper surface of the third electrically insulating layer 37. Many of the above-described steps are disclosed in U.S. Pat. No. 5,780,336 to Son, entitled "Methods of Forming Integrated Circuit Memory Devices Having Improved Storage Electrode Contact Regions Therein" and in U.S. Pat. No. 5,926,707 to Seo, entitled "Methods of Forming Integrated Circuit Memory Devices Having Deep Storage Electrode Contact Regions Therein for Improving Refresh Characteristics", assigned to the present assignee, the disclosure of which is hereby incorporated herein by reference.

Referring now to FIG. 2, a titanium nitride (TiN) layer 16 having a preferred thickness in a range between about 10 A and 200 A is then formed on the first capacitor electrodes 15, as illustrated. This titanium nitride layer 16 may be formed using a chemical vapor deposition (CVD) technique using titanium chloride ($TiCl_4$) as a source gas. Alternatively, the titanium nitride layer 16 may be formed by depositing a titanium metal layer having a thickness in a range between about 10 A and 50 A using a chemical or physical deposition technique (CVD or PVD) and then phase transitioning the titanium metal layer into a titanium nitride layer by performing a heat treatment step (i.e., annealing step) while exposing the titanium metal layer to a nitrogen ambient.

Figure 3A:
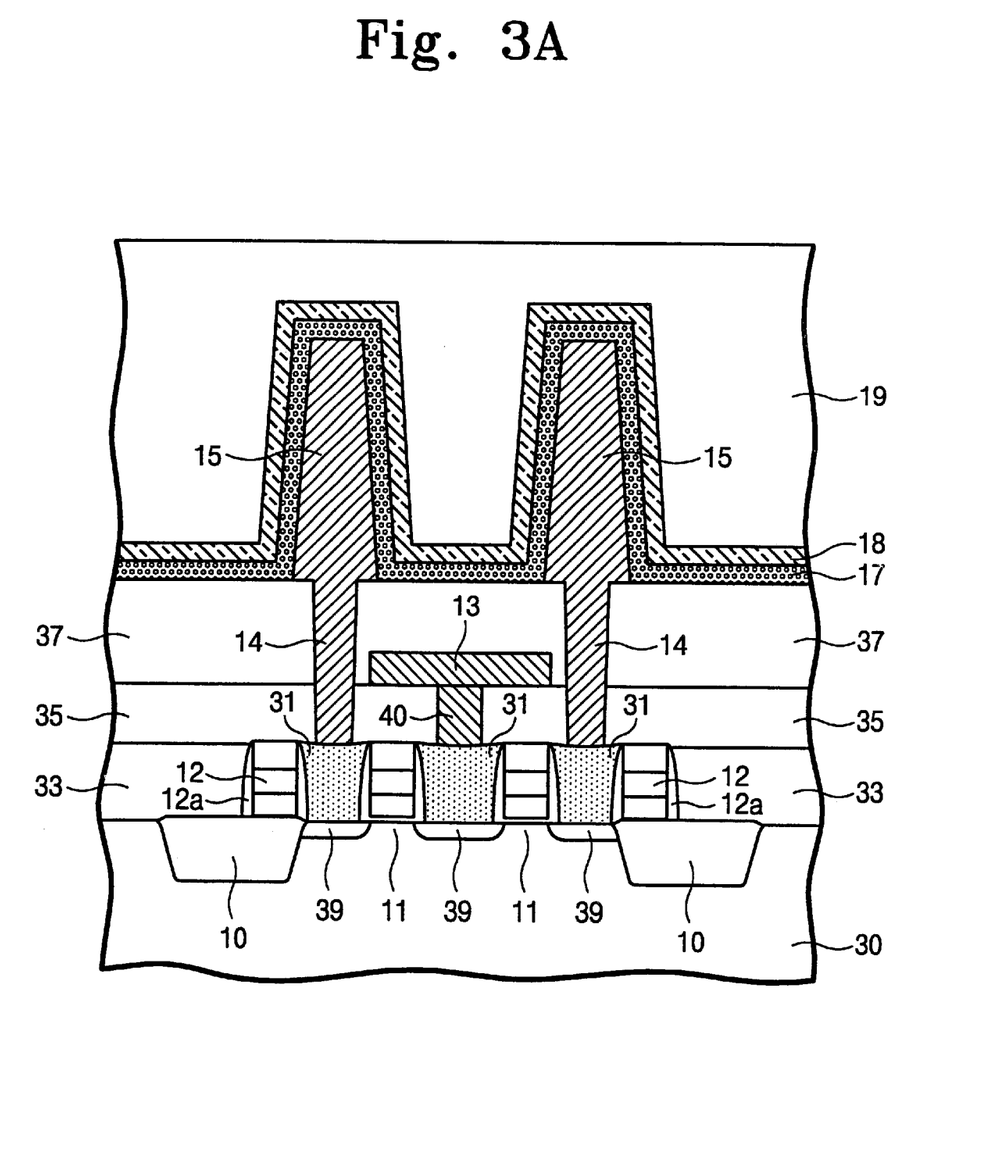
Figure 3B:
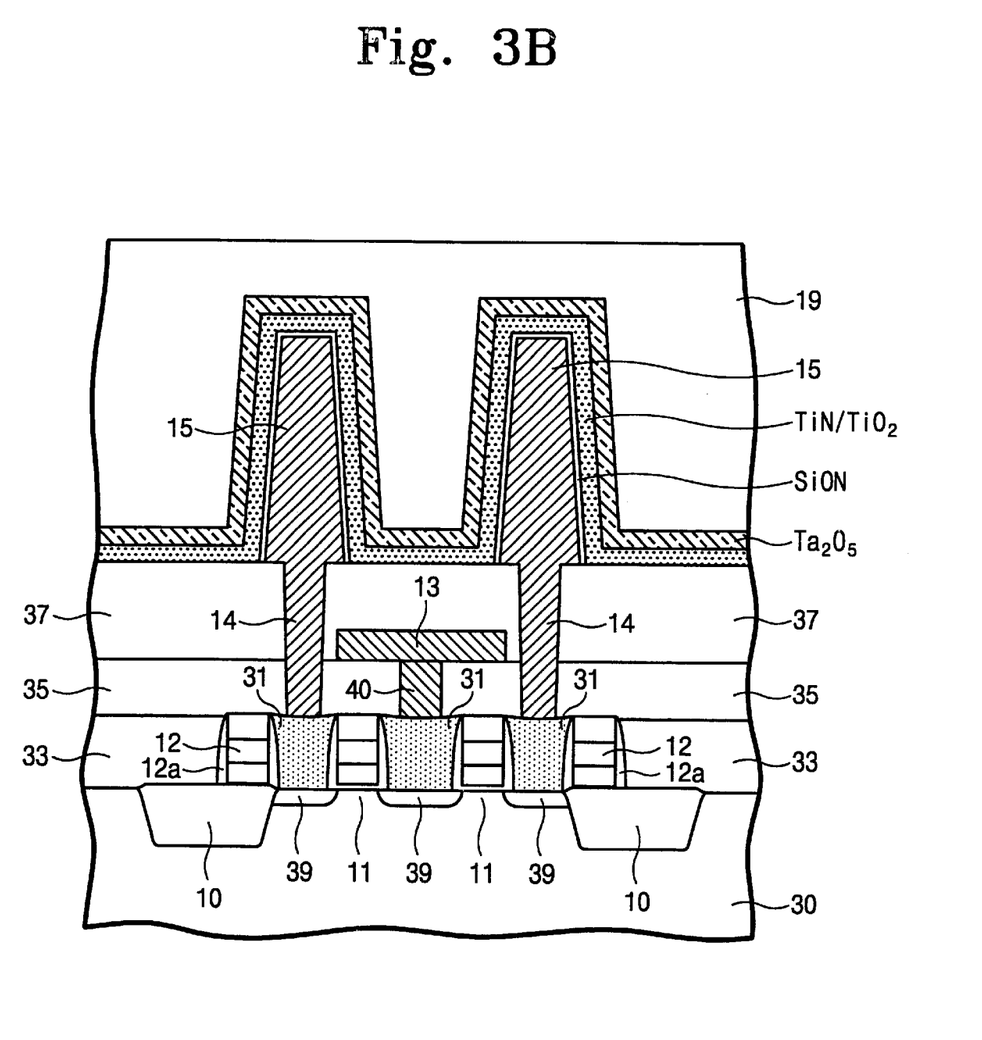

Referring now to FIG. 3A, a tantalum pentoxide ($Ta_2O_5$) layer 18 having a preferred thickness in a range between about 20 A and 100 A is then formed on the titanium nitride layer 16. An annealing step is then performed, preferably at a temperature in a range between about 700° C. and 900° C., while simultaneously exposing the tantalum pentoxide layer 18 to an oxygen ($O_2$) ambient to improve the leakage current characteristics of the tantalum pentoxide layer 18. The temperature at which the annealing step is performed may be a fixed temperature or may vary. During this step, vacancies within the tantalum pentoxide layer 18 are preferably filled with oxygen. In addition, the occurrence of cross-diffusion of free oxygen from the ambient into the underlying titanium nitride layer 16 can be used advantageously to convert the underlying titanium nitride layer 16 into a titanium oxide (e.g., $TiO_2$) layer 17. The deposition of titanium oxide directly onto the polysilicon first capacitor electrode 15 is not preferred since such deposition typically causes parasitic oxidation of the polysilicon therein. Such parasitic oxidation can lead to the undesirable formation of a parasitic capacitor having silicon dioxide as the dielectric. The capacitor structure is then completed by forming a second capacitor electrode 19 on the tantalum pentoxide layer 18. According to another preferred aspect of this embodiment of the invention, the cross-diffusion of oxygen and nitrogen may also result in the formation of a composite dielectric layer comprising an underlying silicon oxynitride layer (SiON), an intermediate titanium dioxide layer ($TiO_2$) and an overlying tantalum pentoxide layer ($Ta_2O_5$). (See FIG. 3B).

Figure 4:
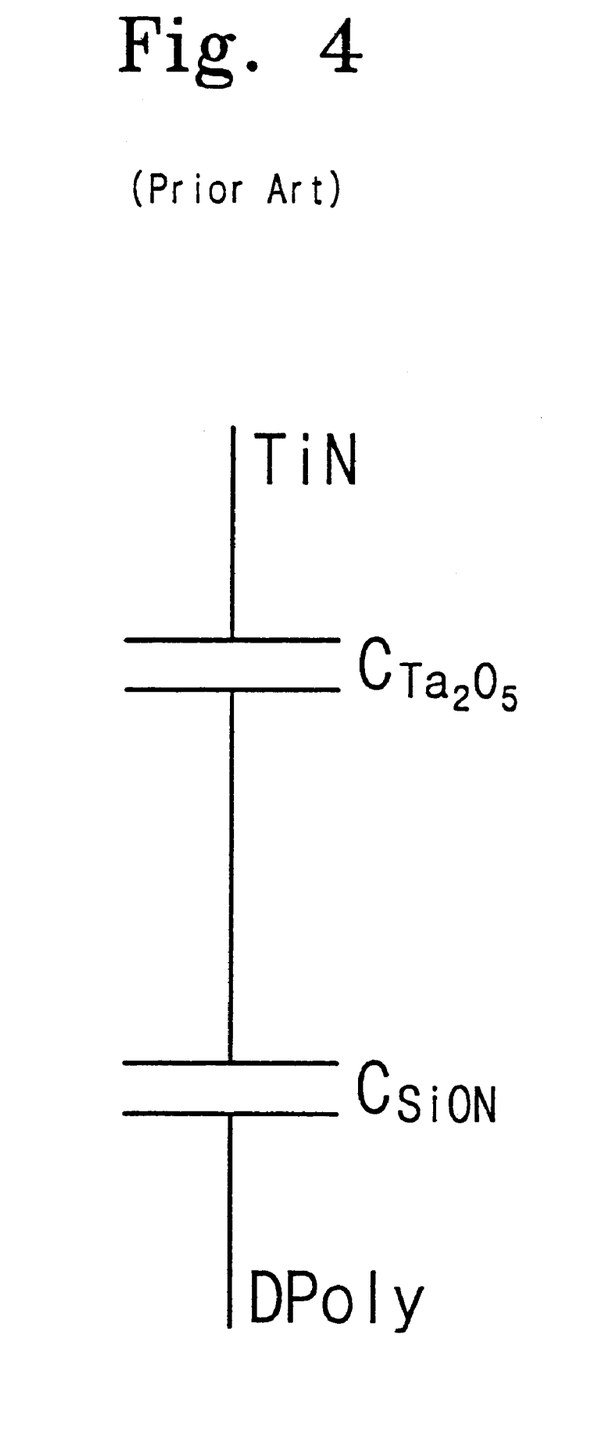
FIG. 4 is an electrical schematic of a conventional integrated circuit capacitor having a composite dielectric layer comprising silicon oxynitride and tantalum pentoxide.
Figure 5:
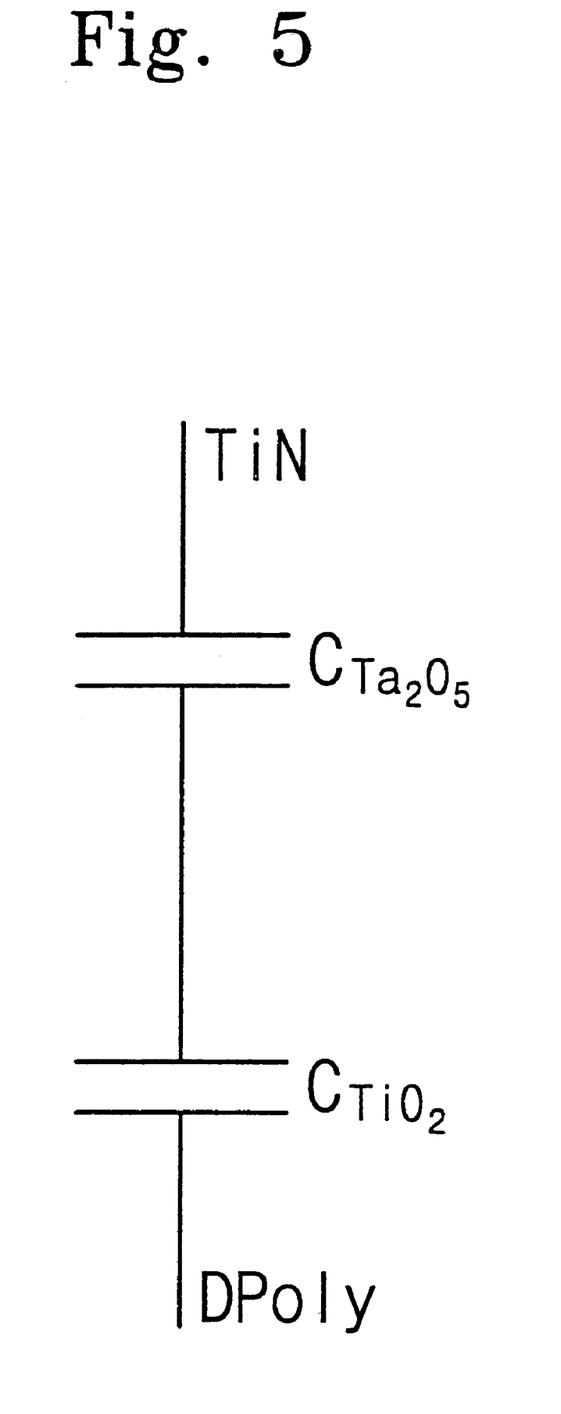
FIG. 5 is an electrical schematic of an integrated circuit capacitor formed in accordance with the methods of FIGS. 1–3.

Referring now to FIG. 4, an electrical schematic of a conventional integrated circuit capacitor having a dielectric layer comprising a composite of a silicon oxynitride layer and a tantalum pentoxide layer is illustrated. In contrast, FIG. 5 is an electrical schematic of an integrated circuit capacitor formed in accordance with a first embodiment of the present invention where the dielectric layer comprises a composite of a titanium dioxide layer and a tantalum pentoxide layer.

Figure 6:
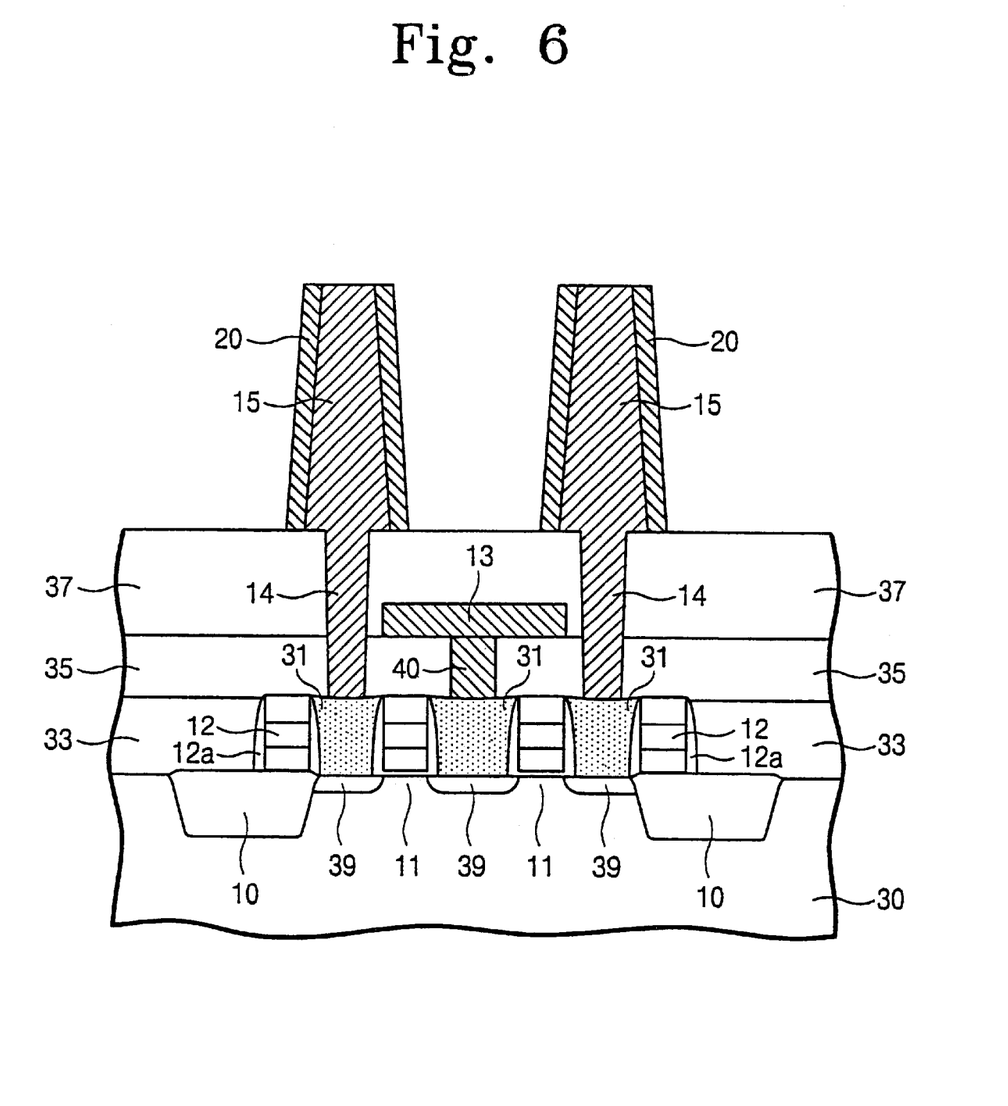
Figure 7:
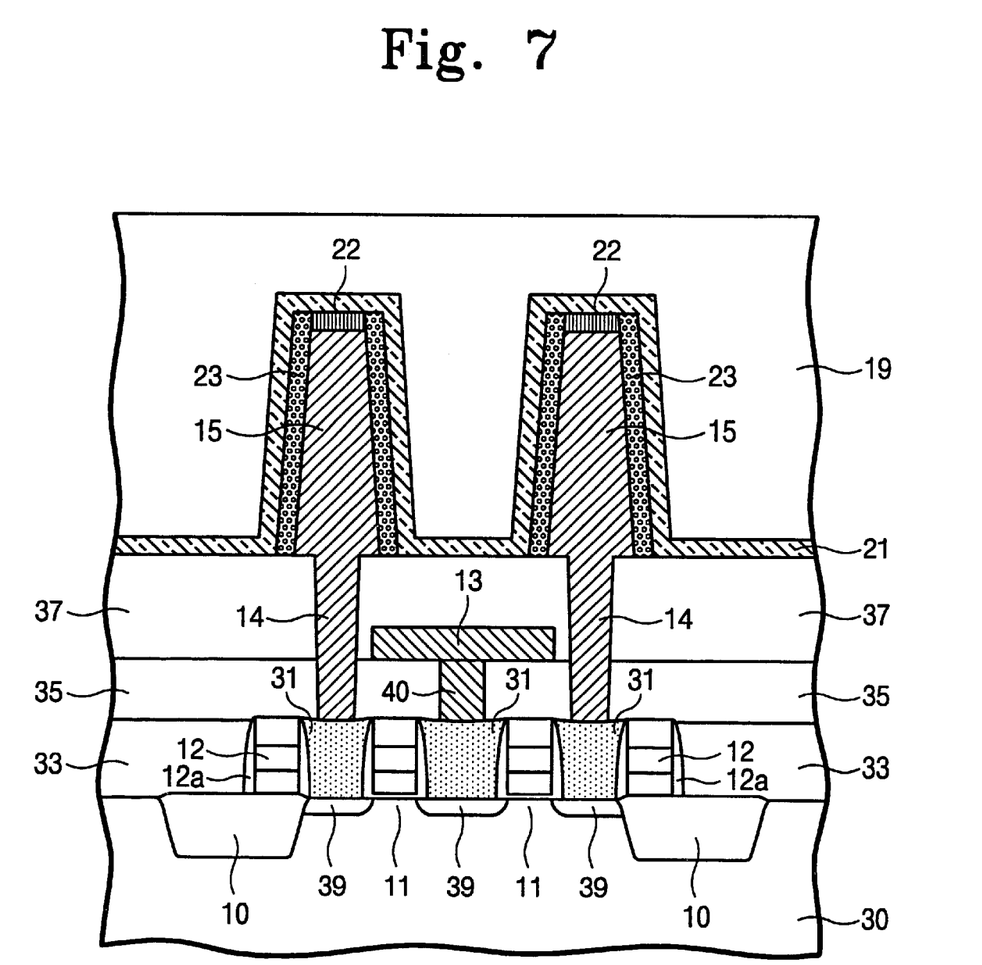
Figure 8:
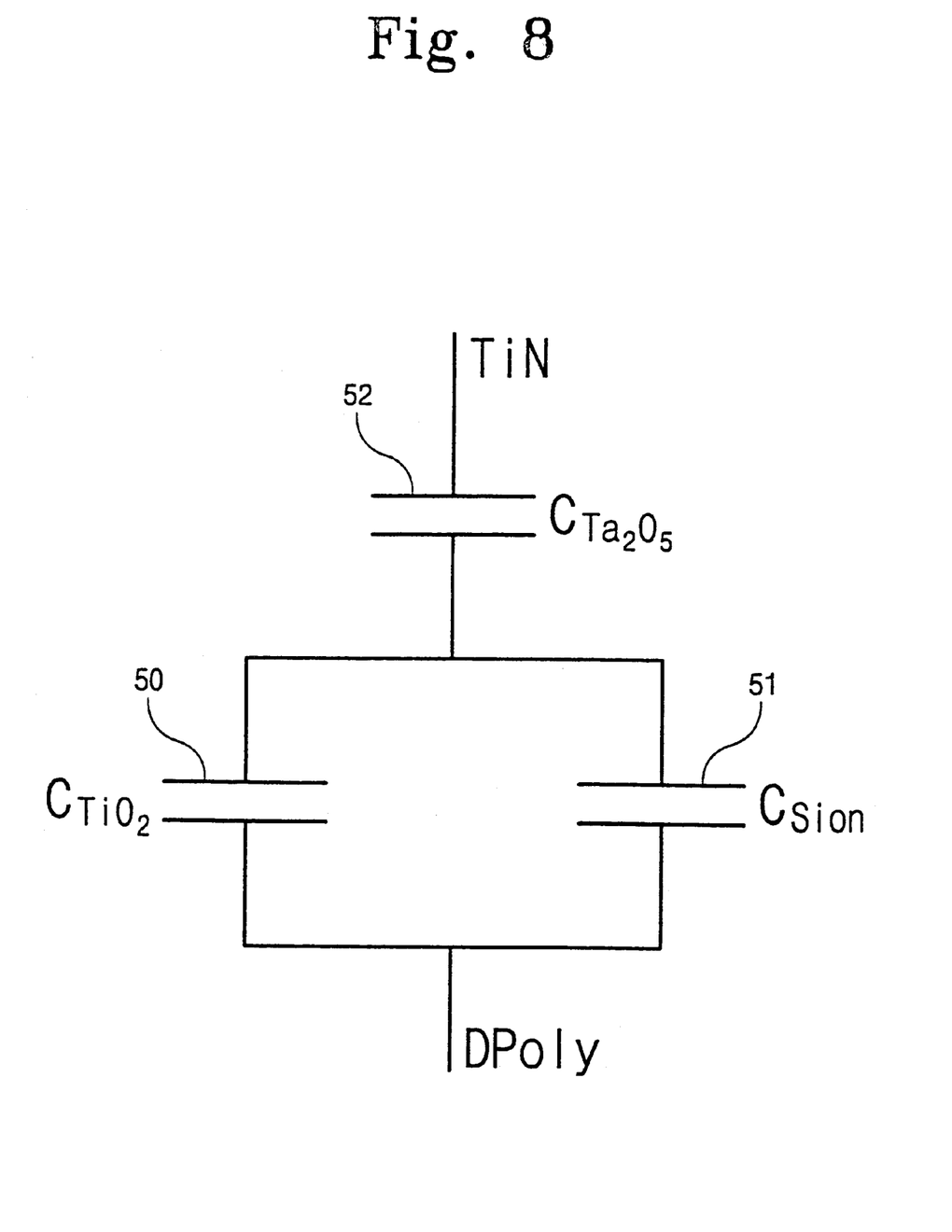
FIG. 8 is an electrical schematic of an integrated circuit capacitor formed in accordance with the methods of FIGS. 2 and 6–7.

Referring now to FIGS. 2 and 6–8, preferred methods of forming integrated circuit capacitors according to a second embodiment of the present invention are illustrated. In particular, FIG. 6 illustrates the performance of a titanium nitride etch-back step on the structure of FIG. 2, so that titanium nitride layers 20 are formed on sidewalls of the first capacitor electrode 15 and the upper surface of the first capacitor electrode 15 is exposed. Then, as illustrated by FIG. 7, a silicon oxynitride layer 22 (SiON) is formed on the exposed upper surface of the first capacitor electrode 15 by thermal annealing the structure of FIG. 6 in an ambient containing oxygen and nitrogen. During this step, the titanium nitride layers 20 are also converted into titanium dioxide layers 23. As a preferred embodiment in accordance with this invention, the whole titanium nitride layer 20 can be converted into titanium dioxide layers 23. As another preferred embodiment in accordance with this invention, only a part of the titanium nitride layer 20 can be converted into titanium dioxide layers 23. In the latter case, the remaining titanium nitride layer, which has not been converted into titanium dioxide layer, can be employed as a part of the bottom electrode of the capacitor. In addition, the remaining non-converted titanium nitride layer can be transformed into silicon oxynitride (SiON) either partially or as a whole. After this annealing step, a tantalum pentoxide layer 21 is formed on the sidewall titanium dioxide layers 23 and on the silicon oxynitride layer 22, as illustrated. Referring now to FIG. 8, an electrical schematic of the integrated circuit capacitor of FIG. 7 is illustrated. Here, the separate titanium dioxide layers 23 and silicon oxynitride layer 22 result in the formation of separate parallel capacitors 50 and 51 within the integrated circuit capacitor structure of FIG. 7. The electrical schematic of the preferred integrated circuit capacitor also includes a tantalum pentoxide capacitor 52 in series with the parallel combination of the titanium dioxide capacitor 50 and silicon oxynitride capacitor 51.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit capacitor, comprising
   a first capacitor electrode;
   a silicon oxynitride layer on said first capacitor electrode;
   a titanium oxide layer on said silicon oxynitride layer;
   a tantalum pentoxide layer on said silicon oxynitride layer; and
   a second capacitor electrode on said tantalum pentoxide.

2. The integrated circuit capacitor of claim 1, further comprising a titanium nitride layer extending between the first capacitor electrode and the silicon oxynitride layer.

3. An integrated circuit capacitor, comprising
   a first capacitor electrode;
   a silicon oxynitride layer on a first portion of said first capacitor electrode;
   a titanium oxide layer on a second portion of said first capacitor electrode;
   a tantalum pentoxide layer on said silicon oxynitride layer and said titanium oxide layer, opposite said first capacitor electrode; and
   a second capacitor electrode on said tantalum pentoxide layer, opposite said silicon oxynitride layer and said titanium oxide layer.

4. The integrated circuit capacitor of claim 3, further comprising a titanium nitride layer extending between the second portion of the first capacitor electrode and the titanium oxide lay.

* * * * *